US009584576B2

(12) United States Patent
Marshall et al.

(10) Patent No.: US 9,584,576 B2
(45) Date of Patent: Feb. 28, 2017

(54) LOSSLESS DATA CODING FOR BIDIRECTIONAL COMMUNICATION IN A COLLABORATIVE SESSION OF MULTIMEDIA CONTENT EXCHANGE

(75) Inventors: James Iain Marshall, St Pierre les Nemours (FR); Petru Mihai Mitrea, Savigny sur Orge (FR); Bojan Joveski, Paris (FR); Ludovico Gardenghi, L'Hay les Roses (FR); Jacqueline Françoise Preteux, Paris (FR)

(73) Assignees: PROLOGUE, Les Ulis (FR); INSTITUT MINES-TELECOM, Paris (FR)

( * ) Notice: Subject to any disclaimer, the term of this patent is extended or adjusted under 35 U.S.C. 154(b) by 470 days.

(21) Appl. No.: 14/002,650

(22) PCT Filed: Mar. 1, 2012

(86) PCT No.: PCT/FR2012/050428
§ 371 (c)(1),
(2), (4) Date: Apr. 8, 2014

(87) PCT Pub. No.: WO2012/117206
PCT Pub. Date: Sep. 7, 2012

(65) Prior Publication Data
US 2014/0219295 A1    Aug. 7, 2014

(30) Foreign Application Priority Data

Mar. 3, 2011 (FR) ...................................... 11 51727

(51) Int. Cl.
*H04L 29/06* (2006.01)
*H03M 7/30* (2006.01)
*H04N 21/643* (2011.01)

(52) U.S. Cl.
CPC ........ *H04L 65/607* (2013.01); *H03M 7/3088* (2013.01); *H04L 65/1069* (2013.01);
(Continued)

(58) Field of Classification Search
CPC ..................................................... H04L 65/607
(Continued)

(56) References Cited

U.S. PATENT DOCUMENTS 5,617,539 A * 4/1997 Ludwig .................. G06Q 10/10
                                                    348/14.03
5,832,289 A * 11/1998 Shaw ...................... G06F 9/465
                                                    348/E5.108
(Continued)

FOREIGN PATENT DOCUMENTS

CA   WO 2008004147 A2 *  1/2008  ....... H04L 29/06027
EP              1376878       1/2004
(Continued)

OTHER PUBLICATIONS

Saint-Andre, "Extensible Messaging and Presence Protocol (XMPP): Core", RFC 6120, 2011.*
(Continued)

*Primary Examiner* — O. C. Vostal
(74) *Attorney, Agent, or Firm* — MH2 Technology Law Group, LLP

(57) ABSTRACT

The disclosed method for coding data includes the exchange between the transmitter and the receiver, in the course of the session, of attributes of collaboration messages that are able to be used in said session and of indices associated with these attributes. In various implementations, the attributes and their indices may be used by these pieces of equipment for updating a shared dictionary of indexed attributes. Upon coding, the attributes of the collaboration messages may be substituted with their indices; and upon decoding, the (Continued)

Figure 1:
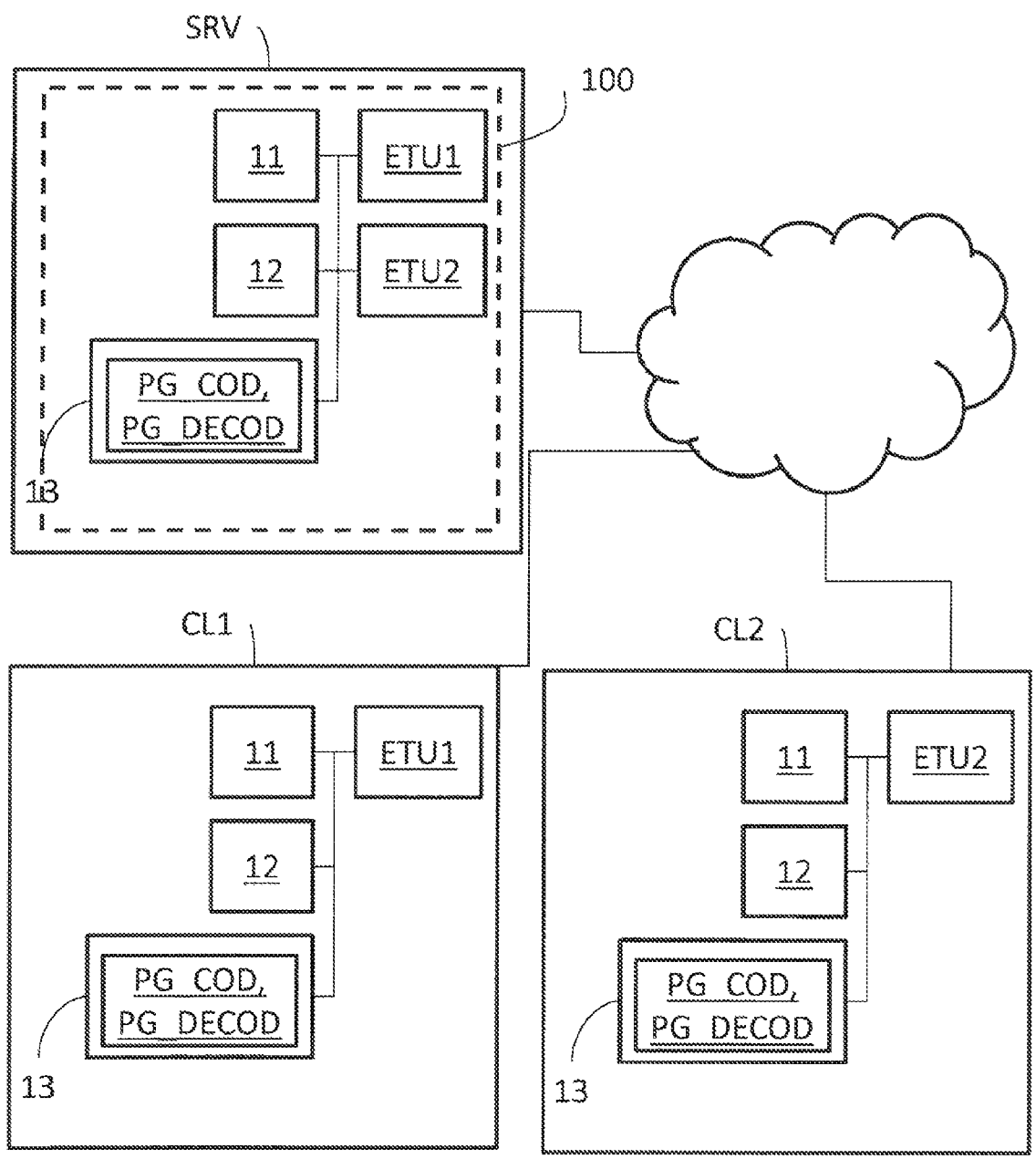

inverse operation may be carried out. The shared dictionaries may be destroyed at the end of the session.

18 Claims, 2 Drawing Sheets

(52) U.S. Cl.
CPC ........ *H04L 65/4038* (2013.01); *H04L 65/608* (2013.01); *H04N 21/643* (2013.01)

(58) Field of Classification Search
USPC .......................................................... 709/247
See application file for complete search history.

(56) References Cited

U.S. PATENT DOCUMENTS

| | | | | |
|---|---|---|---|---|
| 5,862,059 A * | 1/1999 | Matula | ................. | G06F 1/0356 708/270 |
| 6,496,870 B1 * | 12/2002 | Faustini | ................. | G06F 8/20 717/107 |
| 6,606,744 B1 * | 8/2003 | Mikurak | ................. | H04L 29/06 717/174 |
| 7,206,934 B2 * | 4/2007 | Pabla | ................. | H04L 63/02 709/226 |
| 8,055,656 B2 * | 11/2011 | Cradick | ................. | G06F 17/30997 707/709 |
| 9,124,650 B2 * | 9/2015 | Maharajh | | |
| 2004/0064512 A1 * | 4/2004 | Arora | ................. | H04L 51/04 709/206 |
| 2005/0187895 A1 * | 8/2005 | Paya | ................. | G06F 17/3089 |
| 2006/0015557 A1 * | 1/2006 | Bodin | ................. | H04L 69/328 709/204 |
| 2006/0184432 A1 * | 8/2006 | Hanechak | ................. | G06Q 30/02 705/26.5 |
| 2006/0288183 A1 * | 12/2006 | Boaz | ................. | G06F 11/1451 711/164 |
| 2007/0016411 A1 * | 1/2007 | Kim | ................. | G10L 19/02 704/226 |
| 2007/0067482 A1 * | 3/2007 | Johnson | ................. | G06F 17/30017 709/231 |
| 2007/0260643 A1 * | 11/2007 | Borden | ................. | G06F 17/30097 |
| 2008/0059631 A1 * | 3/2008 | Bergstrom | ................. | H04N 7/17318 709/224 |
| 2009/0254572 A1 * | 10/2009 | Redlich | ................. | G06Q 10/06 |
| 2009/0254843 A1 * | 10/2009 | Van Wie | ................. | H04L 12/1822 715/757 |
| 2009/0275414 A1 * | 11/2009 | Lee | ................. | A63F 13/12 463/42 |
| 2010/0049511 A1 * | 2/2010 | Ma | ................. | G10L 19/08 704/221 |
| 2011/0035687 A1 * | 2/2011 | Katis | ................. | H04L 12/1827 715/758 |
| 2012/0210334 A1 * | 8/2012 | Sutedja | ................. | G06Q 10/107 719/314 |
| 2013/0144611 A1 * | 6/2013 | Ishikawa | ................. | G10L 19/26 704/207 |
| 2014/0129543 A1 * | 5/2014 | Solheim | ................. | G06F 17/30864 707/711 |

FOREIGN PATENT DOCUMENTS

| | | |
|---|---|---|
| WO | 2005011175 | 2/2005 |
| WO | 2008/004147 | 1/2008 |

OTHER PUBLICATIONS

Saint-Andre, "Extensible Messaging and Presence Protocol (XMPP): Core", RFC 3920, 2004.*
Hannu et al., "Signaling Compression (SigComp)—Extended Operations", RFC 3321, 2003.*
Price et al., "Signaling Compression (SigComp)", RFC 3320, 2003.*
International Search Report dated Jul. 18, 2012 from International Application No. PCT/FR2012/050428 filed Mar. 1, 2012, pp. 1-4.
Saint-Andrew, C.P. Extensible Messaging and Presence Protocol (XMPP). Core, Sep. 2, 2010, vol. 14, pp. 1-183, XP015071085.
Siemens, R. Price et al. Signaling Compression (SigComp). RFC 3320, IETF Standard Internet Engineering Task Force, Jan. 1, 2003, pp. 1-66.

* cited by examiner

LOSSLESS DATA CODING FOR BIDIRECTIONAL COMMUNICATION IN A COLLABORATIVE SESSION OF MULTIMEDIA CONTENT EXCHANGE

CROSS-REFERENCE TO RELATED APPLICATIONS

This application is a U.S. National Stage application of PCT/FR2012/050428 filed Mar. 1, 2012, which claims priority to French Application No. 1151727 filed Mar. 3, 2011, the entire disclosures of which are hereby incorporated by reference in their entireties.

BACKGROUND OF THE INVENTION

The present invention is located in the field of lossless data coding.

It more particularly but not in a limiting way applies for coding without any loss of transport data used for multimedia flow control according to a standard of the MPEG family.

In the present state of the art, the standards MPEG-4 FF (File Format) and MPEG-2 TS (Transport Stream) provide solutions for formatting and transporting multimedia contents, notably in terms of binary coding of the video stream, of the audio stream and of the representation of the scene.

This standard is well adapted for static use of the multimedia contents in which the interactivity between the contents server and the client restoring the contents is highly reduced.

But the solutions known to this day are poorly adapted to strongly interactive communications and a fortiori to collaborative applications, the weight of the data for transporting collaborative information may be excessively a burden.

The invention aims at a coding mechanism which notably allows considerable reduction in the volume of these data.

OBJECT AND SUMMARY OF THE INVENTION

More specifically and according to a first aspect, the invention relates to a method for lossless data coding applied by a piece of transmitter equipment, in bidirectional communication with at least one piece of receiver equipment in a collaborative session for exchanging multimedia contents. This method includes:
during said session, at least:
  one step for exchanging with the receiver equipment, at least one attribute of a collaboration message which may be used in the session and an index associated with this attribute, this attribute and its index being used by this equipment for updating a shared dictionary of indexed attributes, this dictionary being stored in memory by each of these pieces of equipment during the whole duration of the session;
  one step for substituting, in a collaboration message intended to be sent to the receiver equipment, at least one attribute with its index in the shared dictionary;
  one step for sending the collaboration message to the receiver equipment; and
  one step for destroying the shared dictionary at the end of the session.

Correlatively, the invention also relates to a lossless data coding device which may be incorporated in transmitter equipment capable of establishing a bidirectional communication with at least one piece of receiver equipment in a collaborative session for exchanging multimedia contents. This device includes:
means for exchanging with the receiver equipment, during the session, at least one attribute of a collaboration message which may be used in the session and an index associated with this attribute, the attribute and its index being used by these pieces of equipment for updating a shared dictionary of indexed attributes;
means for storing in memory the shared dictionary during the whole duration of the session;
means for substituting, in a collaboration message intended to be sent to the receiver equipment, at least one attribute with its index in the shared dictionary;
means for sending the collaboration message to the pieces of receiver equipment; and
means for destroying the shared dictionary at the end of the session.

According to a second aspect, the invention also aims at a data decoding method applied by a piece of receiver equipment, in bidirectional communication with at least one piece of transmitter equipment in a collaborative session of exchange of multimedia contents, this method including:
during said session, at least:
  one step for exchanging with the pieces of receiver equipment, at least one attribute of a collaboration message which may be used in the session and one index associated with this attribute, the attribute and its index being used by this equipment for updating a shared dictionary of index attributes, this dictionary being stored in memory by each of the pieces of equipment during the whole duration of the session; and
  one step for receiving a collaboration message transmitted by one of the pieces of transmitter equipment including at least one index;
  one step for substituting, in this collaboration message, each of these indices with the attribute with which it is associated in the shared dictionary; and
  one step for destroying the shared dictionary at the end of the session.

Correlatively, the invention also aims a data decoding device which may be incorporated in a piece of receiver equipment capable of establishing a bidirectional communication with at least one piece of transmitter equipment in a multimedia content exchange collaborative session, this device including:
means for exchanging with the pieces of transmitter equipment, during said session, at least one attribute of a collaboration message which may be used in the session and an index associated with this attribute, the attribute and its index being used by these pieces of equipment for updating a shared dictionary of indexed attributes;
means for receiving a collaboration message transmitted by one of these pieces of emitter equipment including at least one index;
means for substituting, in the collaboration message, each of the indices with the attribute with which it is associated within the shared dictionary; and
means for destroying the shared dictionary at the end of the session.

Thus, and generally, the invention proposes substitution of the attributes present in collaboration messages with indices associated with these attributes in a dictionary shared between the transmitter and the receivers of this message.

According to the invention, the collaboration messages are messages exchanged between a transmitter and a receiver, once the latter has been localized, for example by using the SIP protocol.

It is important to note that the collaboration messages coded with the invention are by nature unpredictable, unlike the messages exchanged during the preliminary phase of the invention, within the scope of the SIP protocol for example.

The invention may be applied in addition or not to another compression mechanism of the SIP protocol.

The sharing of the collaboration data according to the invention requires an extension of the coder for producing coded data and of the decoder for their utilization.

Replacing an attribute with an index may be advantageously used for encrypting the attributes, the indices for example being formed by a hash of the attributes.

In a particular embodiment of the invention, the size of an attribute is greater than the size of its index in the shared dictionary. The coding method according to the invention is then a lossless data compression method.

In a particular embodiment, the size of the shared dictionary allows determination of the number of bits required for the indices of the following attributes shared between the transmitter and the receiver.

In a particular embodiment, the multimedia contents are compliant with a standard of the MPEG family.

The invention thus allows a lossless coding method for transport data used for controlling MPEG communication flows. It provides a particularly effective mechanism for compressing transport data in the context of collaborative bidirectional applications for which a quite limited number of attributes is exchanged for a great number of times between the various devices participating in the session.

In particular, the invention provides a particularly significant compression level for applications in which pieces of information of presence or state notification messages are regularly exchanged between clients and a central server.

It is recalled that for collaboration applications involving N participants connected to a same collaboration session, N*(N-1) presence messages are regularly exchanged between the participants, for example every two or three seconds. Thus, for 10,000 connected users and 100 byte presence messages, 10 Gbytes are exchanged in each time interval.

For such applications, the invention allows reduction of this volume by about a factor 10 (1 Gbyte).

This compression level may be obtained by means of the invention, because of the sharing during the whole session of the indices associated with the most costly pieces of information, for example identifiers of the collaboration space, domain names, identifiers of the participants, . . .

The shared dictionary is advantageously destroyed at the end of the session so as not to unnecessarily clutter the memory of the different pieces of equipment.

According to the invention, the contents of the dictionary shared between the coder and the decoder increases if necessary during the course of the session. This feature advantageously provides a highly flexible solution in terms of complexity.

In a particular embodiment of the invention, the session applies the RTP protocol for exchange of multimedia data and the RTSP protocol for initialization and control of this exchange.

In this context, the invention gives the possibility of reducing the additional payload required for transporting collaboration data to its strict minimum and therefore optimization of the use of the bandpass for transporting the multimedia contents, strictly speaking (audio, video and scene illustration data).

In a particular embodiment of the invention, each piece of equipment is capable of applying the coding method and the decoding method according to the invention.

Therefore, the invention also aims at a communication device including a coding device according to as mentioned above and a decoding device as mentioned above.

The invention also aims at a piece of communication equipment including a device as mentioned above.

The invention also aims at a collaboration system including at least two pieces of equipment as mentioned above.

In a particular embodiment of the invention, the collaborative session is compliant with the XMPP standard.

In a particular embodiment of the invention, the coding method and the decoding method according to the invention are applied by computer programs.

Therefore, the invention also aims at a computer program on an information medium, this program being capable of being applied by a computer, this program including instructions adapted for applying the steps of a coding method and/or of a decoding method as mentioned above.

This program may use any programing language and be in the form of source code, object code or intermediate code between source code and object code, such as in a partly compiled form, or in any other desirable form.

The invention also aims at a computer-legible information medium, and including instructions of a computer program as mentioned above.

The information medium may be any entity or device capable of storing the program. For example, the medium may include a storage means, such as ROM, for example a CDROM or a micro-electronic circuit ROM, or further a magnetic recording means, for example a diskette (floppy disc) or a hard disc.

On the other hand, the information medium may be a transmissible medium such as an electrical or optical signal, which may be conveyed via an electrical or optical cable, by radio or by other means. The program according to the invention may in particular be downloaded over a network of the Internet type.

Alternatively, the information medium may be an integrated circuit into which the program is incorporated, the circuit being adapted for executing or for being used in the execution of the relevant method.

SHORT DESCRIPTION OF THE DRAWINGS

Figure 2:
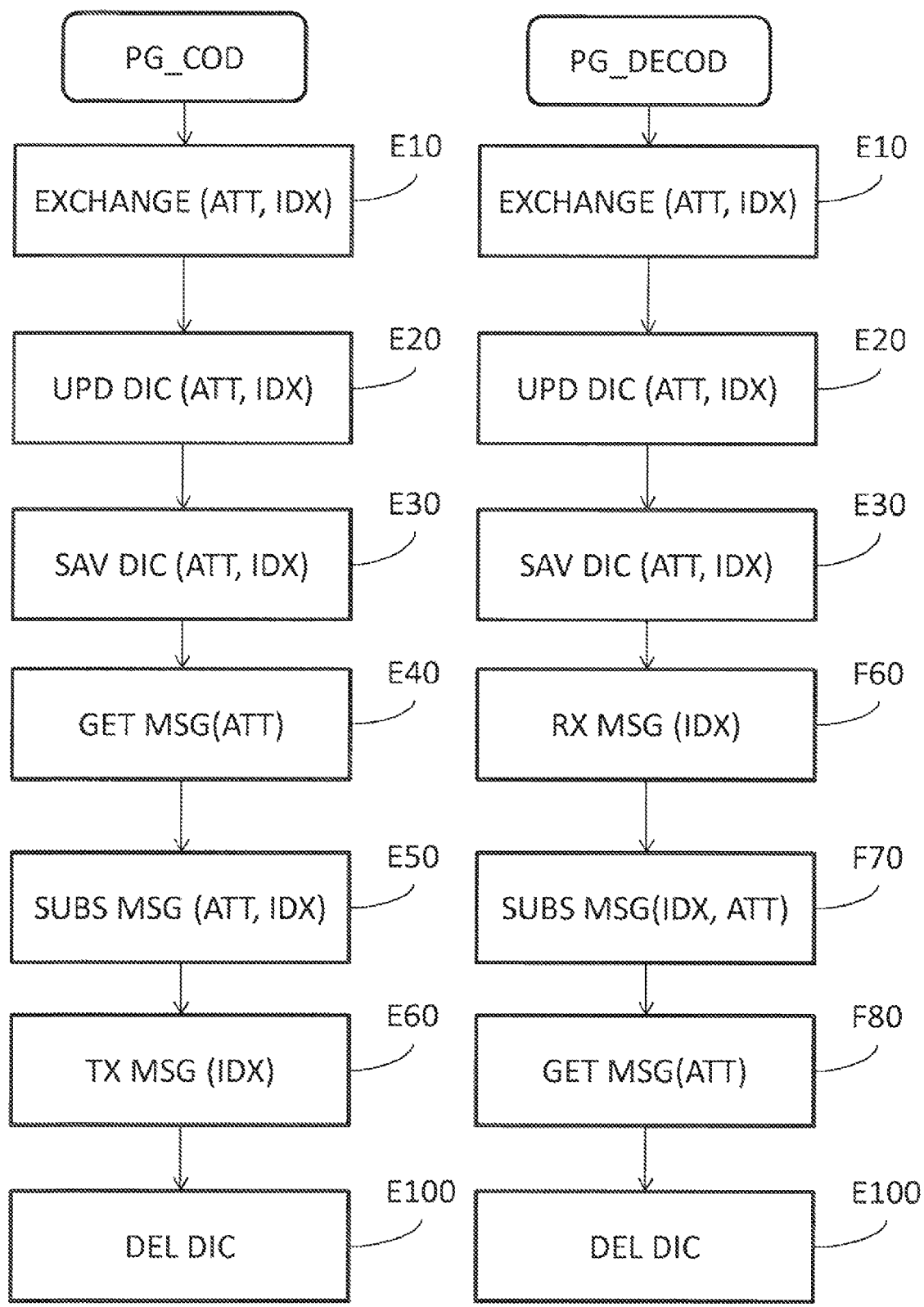

Other features and advantages of the present invention will become apparent from the description made below with reference to the drawings and to the annexes which illustrate an exemplary embodiment thereof without any limitation. In the figures:

FIG. 1 schematically illustrates an example of a collaboration system according to the invention; and FIG. 2 illustrates in the form of flow charts, the main steps of a coding method and of a decoding method according to a particular embodiment of the invention.

DETAILED DESCRIPTION OF AN EMBODIMENT

Firstly, and with reference to Annexes 1 and 2, we shall detail a coding example which may be used in the invention.

In the exemplary embodiment described here, the collaboration messages are described by using the XMPP (Extensible Message and Presence Protocol) standard; the encapsulation and the transport of the multimedia flows used is compliant with the MPEG format.

It is recalled that the invention is applied once the transmitters and receivers have been localized, for example aria the SIP protocol.

In the exemplary embodiment described here, the collaboration messages coded by the invention may be of 4 natures.

The collaboration messages of a first nature are listing messages used for updating the shared dictionary during the session.

The collaboration messages of the three other natures are, in this example:

the CIP messages specifying a state of presence of the transmitter equipment;
the CIM messages including information intended for the receiver equipment; and
CIQ messages including metadata for administration or control of a collaboration system in which the session is applied.

For the collaboration messages other than the listing messages: the following attributes are used in this example:
<<Type>>: which defines the semantics of the nature and which is coded with a predetermined value for each of the types;
<<To>>: which defines the addressee of the message;
<<From>>: which defines the transmitter of the message; and
<<ID>> which defines a piece of information allowing identification of the message by the collaborative application.

In the particular embodiment of the invention described here, the collaboration method includes:
a representative field of the nature of the message; and for the collaboration messages other than the listing messages:
a representative attribute of the semantics of the nature of the message; and
a binary element representative of the presence or not of an attribute in said message, followed, when the attribute is present, by a body including the index associated with the attribute in the shared dictionary.

In the embodiment described here, and as illustrated in Annex 1, the coding of the collaboration information uses a two-bit field CIUNature for describing the nature of the collaboration message. More specifically:
00 represents a listing message used for exchanging data of the shared dictionary ETU;
01 represents a CIP message;
10 represents a CIM message; and
11 represents a CIQ message.

For the CIP, CIM and CIQ messages, the description field CIUNature on two bits is followed by:
a CIUType element representative of the semantics of the nature of the message; and for each of the attributes TO, FROM, ID, a binary element representative of the presence or not of this attribute in the message, followed, when the attribute is present, by a body including the index associated with this attribute in the shared dictionary ETU.

When it is present, the body is coded by using the indices of the shared dictionary for describing the various attributes, as illustrated on example in Annex 1.

More specifically, in this example, the body includes:
an ETI field providing the index of the shared dictionary for describing the name of the main element;
a collection of attributes with this main element and for each attribute, signaled beforehand by one bit, a pair of indices of the shared dictionary representing in this order their name and their value;
contents, of the text type, signaled by one bit and consisting of a string of ASCII characters terminated by a zero byte; and
a collection of elements signaled beforehand by their presence bit followed by their recursive description like for the main element.

As an example the following XMPP presence message is considered as an example, this message being intended to be transmitted by a client after an initialization phase.

<presence from='john@somewhere.com' to='host@collaborator.com'/>

The length of this message is 64 bytes i.e. 512 bits.

According to the invention, this message may be transmitted ail along a session, by a piece of transmitter equipment to a piece of receiver equipment by substituting two attributes TO and FROM with two indices shared by these pieces of equipment during the duration of the session.

Thus, by applying the coding of Annex 1, one obtains:
ETU john@somewhere.com
2 bits of code 00 representative of a listing command; and
8 bits for each byte of the strings of characters
1 NULL termination byte, i.e. 19 bytes all in all.
The implicitly obtained index 00 will be used following the exchange of this ETU as a substitution for this first attribute.
ETU host@collaborator.com
2 bits of code 00 representative of a listing command; and
8 bits for each byte or character strings
1 NULL termination byte, i.e. 22 bytes all in all,
The implicitly obtained index 01 will be used following this exchange of this ETU as a substitution for this second attribute.

The volume of exchange data for the updating of the shared dictionary is therefore 345 bits.

Next, this presence message may be coded by only using 14 bits which are broken down as follows:
2 UP bits
3 bits for coding the type (value 000 by default)
1 bit and 2 bits 00 for the attribute TO
1 bit and 2 bits 01 for the attribute FROM
1 bit 0 (no type)
1 bit 0 (no ID)
1 bit 0 (no body)

For the transmission of the first presence message, the coding according to the invention allows a gain of 153 bits (512-359), but one skilled in the art will understand that the gain becomes highly significant for the transmission of subsequent presence messages (14 bits instead of 512).

Annex 2 gives another coding example according to the invention and its size for a more complex message. This is a text message which may be used in an instantaneous messaging application.

FIG. 1 illustrates a collaboration system according to the invention.

This system more specifically includes a server SRV and 2 clients CL1, CL2 each of these pieces of equipment being communication equipment according to the invention.

Each of these pieces of equipment includes a device 100 according to the invention capable of applying a coding method and a decoding method in accordance with the invention. For the sake of clarity, only that of the server SRV is referenced.

In the exemplary embodiment described here, this device 100 has the conventional architecture of a computer. It notably includes a processor 11, a random access memory of the RAM type 12, a read-only memory of the ROM type 13, communication means not shown.

The read-only memory of the ROM type 13 forms a recording medium according to the invention, legible by the processor 11. This recording medium stores in memory two computer programs PG_COD (coding) and PG_DECOD (decoding) according to a particular embodiment of the invention, and the main steps of which will now be described with reference to FIG. 2.

With reference to FIG. 2, we shall detail an exemplary embodiment of the invention.

In this example, it is assumed that both clients CL1, CL2 participate, under the control of a server SRV, in a same collaborative session.

In this example:
the first client CL1 has the unique identifier cl1 @domaine;
the second client CL2 has the unique identifier cl2@domaine;
the server SRV has the unique identifier srv@domaine.

We shall assume that the first client CL1, the second client CL2 and the server each have working space reserved for the collaborative session, respective unique identifiers cl1@domaine/espace, cl2@domaine/espace and srv@domaine/espace.

We shall assume that the server SRV is online and capable of accepting requests from the clients CL1 CL2 for participating in the collaborative session.

In the example described here it is assumed that the first client who wishes to connect to the server SRV for participating in the collaboration session, after an initialization and authentication phase known per se, is the client CL1.

The client CL1 for this purpose prepares during a step E40, a presence message M1, in order to indicate that it wishes to participate in the collaboration session, of the type:
M1:     <presence     from="cl1@domaine/espace" to="srv@domaine/espace"/>
This message requires two identifiers, "cl1@domaine/espace" and "srv@domaine/espace", which according to the invention should be exchanged with the server SRV and stored in memory in their shared dictionary ETU1.

Therefore, during a step E10, prior to step E40, the client CL1 and the server SRV apply an exchange step during which the client CL1 send to server SRV:
the attribute FROM cl1@domaine/espace associated with an index 0001; and
the attribute TO srv@domaine/espace associated with an index 0002.

During step E20, the client CL1 and the server SRV each update their dictionary ETU1 with both pairs (attribute/index), i.e. (from=cl1@domaine/espace, 0002) and (to=srv@domaine/espace, 0001).

During a step E30, the client CL1 and the server SRV each save their dictionary ETU1.

According to the invention, the client CL1 does not send to the server SRV the message M1 which was prepared in step E40, but substitutes, during a step E50, each of the attributes, TO, FROM with its index in the shared dictionary.

The message M2 resulting from this substitution is therefore the message M2: <0002 0001>

The client CL1 sends the message M2 to the server SRV which receives it during a step F60.

Next, during a step F70, the server SRV substitutes in the message M2, each of the indices 0001, 0002 of the message M2 with the attribute which is associated with it in the shared dictionary ETU.

The message M3 obtained (step F80) is identical with the message M1 mentioned above.

The client CL1 and the server SRV have thus behaved like a coding device and like a decoding device in the sense of the invention.

it will be noted that in a typical collaboration session, the client CL1 regularly sends, about every 2 or 3 s, a presence message to the SRV server.

in this example, the coding of the message M1 requires, including updating of the dictionary, 36 bytes of data, each subsequent presence message only requiring 2 bytes.

We shall now assume that the second client CL2 wishes to participate in the collaborative session, and that it prepares for this purpose a presence message M4 of the type:
M4:     <presence     from="cl2@domaine/ espace"to="srv@domaine/espace"/>

As described earlier for the first client CL1, the second client CL2 applies an exchange step E10 with the server SRV, during which the second client CL2 sends to the server SRV:
the attribute FROM cl2@domaine/espace associated with the index 0002; and
the attribute TO srv@domaine/espace associated with an index 0001.

The second client CL2 and the server SRV update their shared dictionary ETU2 during a step E20 and save it during a step E30.

The coding of message M4 still requires 36 bytes of data.

It will be assumed in this example that the server SRV should signal the presence of the second client CL2 in the collaborative session to the first client CL1.

In this phase, the server SRV and the first client CL1 respectively behave like a coding device and like a decoding device in the sense of the invention.

The server SRV therefore prepares the following message MS during a step E40:
M5:     <presence     from="cl2@domaine/espace" to="cl1@domaine/espace"/>
The coding of the message M5 requires the sending of the new attribute FROM cl2@domaine/espace to the first client CL1 associated with a new index 0002 (step E10).

The server SRV and the first client CL1 update and save their shared dictionary ETU1 during steps E20 and E30 already described.

In the same way, the server SRV notifies the second client CL2 of the presence of the first client CL1 by also sending a 19-byte message.

Each client CL1, CL2 may then regularly send subsequent presence messages each with 2 bytes to the server SRV which notifies them to the other clients.

This principle may be used for exchanging pieces of information of other types.

At the end of the session, each of the pieces of equipment destroys the shared dictionary during a step E100.

---

ANNEX 1

Class ETU {
   Bit(2) ETUType=0;
   Bit(8) ETUValue[till null];
  };
The Collaboration Information Units are as follows:

ANNEX 1

```
Class CIU {
    Bit(2) CIUNature;    /* 01:CIP, 10:CIM, 11:CIQ */
    Bit(3) CIUType;      /* values depending on the preceding nature
field */
    Bit(1) TOFlag;
    If ( TOFlag ) {
        Bit(maxETU) TOValue;
    }
    Bit(1) FROMFlag;
    If ( FROMFlag ) {
        Bit(maxETU) FROMValue;
    }
    Bit(1) IDFlag;
    If ( IDFlag ) {
        Bit(maxETU) IDValue;
    }
    Bit(1) BODYFlag;
    If ( BODYFlag ) {
        BODYElement;
    }
}
BODYElement {
    Bit (maxETU) TAGName;
    While ( Bit(1) ATBFlag ) {
        Bit (maxETU) ATBName;
        Bit (maxETU) ATBValue;
    }
    If ( Bit(1) TEXT ) {
        Bit(8) TEXTBytes[till null];
    }
    While ( Bit(1) MORE ) {
        BODYElement;
    }
}
```

ANNEX 2

```
<message
    from="john@location/viewer"
    to="host@location/scenario"
    type="groupchat"
    id="one">
    <x xmlns="ietf:urn:ns:jabber:client">
        <data>bonjour</data>
    </x>
</message>
Codage
Bits(2) 1 0  _MESSAGE;
Bits(3) 0 1 1 _GROUPCHAT;
Bit(1) 1 { Bits(etuMAX) FROM; }
Bit(1) 1 { Bits(etuMAX) TO; }
Bit(1) 1 { Bits(etuMAX) ID; }
Bit(1) 1 {
    Bits(etuMAX) TAGName; /* x */
    Bit(1) 1 {
        Bits(etuMAX) ATBName; /* xmlns */
        Bits(etuMAX) ATBValue; /* urn:ietf:ns:jabber:client /*
    }
    Bit(1) 0 /* End of Attributs */
    Bit(1) 0 /* No Enclosed Text */
    Bit(1) 1 {
        Bits(etuMAX) TAGName; /* data */
        Bit(1) 0; /* No attributes */
        Bit(1) 1 { Bits(8) TEXT[till null]; } /* Hello */
        Bit(1) 0; /* No nested element */
    } /* /DATA */
    Bit(1) 0; /* No nested element */
} /* /X */
Bit(1) 0; /* No nested element */
} /* /MESSAGE */
Number of required bits
2 + 3 + 1 + n + 1 + n + 1 + n +
1 +
    n + 1+ n + n + 1 +
```

ANNEX 2

```
1 +
1 +
    n + 1
    1 + (8 * 8) +
    1 +
1 +
1
```

The invention claimed is:

1. A method, performed by a microprocessor and a memory, for lossless data coding applied by a piece of transmitter equipment, in bidirectional communication with at least one piece of receiver equipment in a collaborative session of exchange of multimedia contents, which reduces a volume of data compared to a conventional approach, the method comprising:
exchanging with the at least one piece of receiver equipment, during the collaborative session, at least one attribute of a collaboration message which may be used in the collaborative session and an index associated with the at least one attribute, the at least one attribute and the index being used by the piece of transmitter equipment and by the at least one piece of receiver equipment for updating a shared dictionary of indexed attributes, the shared dictionary being stored in memory by both the piece of transmitter equipment and the at least one piece of receiver equipment for the entire duration of the collaborative session;
substituting, in a collaboration message intended to be sent to the at least one piece of receiver equipment, the at least one attribute with the index in the shared dictionary, wherein the size of the at least one attribute is greater than the size of the index in the shared dictionary;
sending the collaboration message to the at least one piece of receiver equipment; and
destroying the shared dictionary at the end of the collaborative session.

2. The method according to claim 1, wherein the collaboration message is selected from the group consisting of:
a listing message for updating of the shared dictionary of indexed attributes during the collaborative session;
a message specifying a state of presence of the at least one piece of transmitter equipment;
a message including pieces of information intended for the piece of receiver equipment; and
a message including metadata for administration or control of a collaboration system.

3. The method according to claim 2, wherein said collaboration message includes:
a field representative of a nature of the collaboration message;
an attribute representative of the semantics of the nature; and
a binary element representative of the presence or not of the attribute in the collaboration message, followed, when the attribute is present, by a body including the index associated with the value of the attribute in the shared dictionary.

4. The method according to claim 1, wherein said collaborative session is compliant with the XMPP standard.

5. The method according to claim 1, wherein the multimedia contents are compliant with a standard of the MPEG family, the collaborative session applying the RTP protocol for exchange of the multimedia contents and the RTSP protocol for initialization and control of the exchange.

6. A method, performed by a microprocessor and a memory, for decoding data applied by apiece of receiver equipment, in bidirectional communication with at least one piece of transmitted equipment in a collaborative session of exchange of multimedia contents, which reduces a volume of data compared to a conventional approach, the method comprising:
exchanging with the at least one piece of transmitter equipment, at least one attribute of a collaborative message with may be used in the collaborative session and an index associated with the at least one attribute, the at least one attribute and the index being used by the piece of receiver equipment and by the at least one piece of transmitter equipment for updating a shared dictionary of indexed attributes, the shared dictionary being stored in memory by both the piece of receiver equipment and the at least one piece of transmitter equipment for the entire duration of the collaborative session;
receiving a collaboration message transmitted by the at least one piece of transmitter equipment including at least one index;
substituting, in the collaboration message the at least one index with the attribute with which the at least one index is associated in the shared dictionary, wherein the size of the at least one attribute is greater than the size of the index in the shared dictionary; and
destroying the shared dictionary at the end of the collaborative session.

7. The method according to claim 6, wherein the collaboration message is selected from the group consisting of:
a listing message for updating of the shared dictionary of indexed attributes during the collaborative session;
a message specifying a state of presence of the at least one piece of transmitter equipment;
a message including pieces of information intended for the piece of receiver equipment; and
a message including metadata for administration or control of a collaboration system.

8. The method according to claim 7, wherein the collaboration message includes:
a field representative of a nature of the collaboration message;
an attribute representative of the semantics of the nature; and
a binary element representative of the presence or not of the attribute in the collaboration message, followed, when the attribute is present, by a body including the index associated with the value of the attribute in the shared dictionary.

9. The method according to claim 6, wherein said collaborative session is compliant with the XMPP standard.

10. The method according to claim 6, wherein the multimedia contents are compliant with a standard of the MPEG family, the collaborative session applying the RTP protocol for exchange of the multimedia contents and the RTSP protocol for initialization and control of this the exchange.

11. A lossless data coding device which may be incorporated into a piece of transmitter equipment capable of establishing a bidirectional communication with at least one piece of receiver equipment in a collaborative session of exchange of multimedia contents, which reduces a volume of data compared to a conventional approach
a memory containing instructions; and
a microprocessor, operably connected to the memory, that executes the instructions to perform operations comprising:
exchanging with the at least one piece of receiver equipment, during the collaborative session, at least one attribute of a collaboration message which may be used in the collaborative session and an index associated with the at least one attribute, the at least one attribute and the index being used by the piece of transmitter equipment and by the at least one piece of receiver equipment for updating a shared dictionary of indexed attributes;
storing in the memory the shared dictionary for the entire duration of the collaborative session;
substituting, in a collaboration message intended to be sent to the at least one piece of receiver equipment, the at least one attribute with the index in the shared dictionary, wherein the size of the at least one attribute is greater than the size of the index in the shared dictionary;
sending the collaboration message to the at least one piece of receiver equipment; and
destroying the shared dictionary at the end of the collaborative session.

12. A communication device including a coding device according to claim 11.

13. Communication equipment including a device according to claim 12.

14. A collaboration system including at least one piece of equipment according to claim 13.

15. A data decoding device which may be incorporated in a piece of receiver equipment capable of establishing a bidirectional communication with at least one piece of transmitter equipment in a collaborative session of exchange of multimedia contents, which reduces a volume of data compared to a conventional approach, the device comprising:
a memory containing instructions; and
a microprocessor, operably connected to the memory, that executes the instructions to perform operations comprising:
exchanging with the at least one piece of transmitter equipment, during the collaborative session, at least one attribute of a collaboration message which may be used in the collaborative session and an index associated with the at least one attribute, the at least one attribute and the index being used by the piece of receiver equipment and by the at least one piece of transmitter equipment for updating a shared dictionary of indexed attributes;
receiving a collaborating message transmitted by the at least one piece of transmitter equipment including at least one index;
substituting, in the collaboration message, the at least one index with the attribute with which the at least one index is associated in the shared dictionary, wherein the size of the at least one attribute is greater than the size of the index in the shared dictionary; and
destroying the shared dictionary at the end of the collaborative session.

16. A communication device including a decoding device according to claim 15.

17. Communication equipment including a device according to claim 16.

18. The collaboration system of claim 14, further including at least one piece of equipment according to claim 17.

* * * * *